(12) United States Patent
Mizugaki

(10) Patent No.: US 12,088,253 B2
(45) Date of Patent: Sep. 10, 2024

(54) CIRCUIT BOARD AND OSCILLATOR DEVICE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 13 days.

(21) Appl. No.: 18/181,094

(22) Filed: Mar. 9, 2023

(65) Prior Publication Data
US 2023/0291353 A1 Sep. 14, 2023

(30) Foreign Application Priority Data

Mar. 11, 2022 (JP) .................. 2022-037855

(51) Int. Cl.
H03B 5/32 (2006.01)
H03B 1/02 (2006.01)
H03B 5/04 (2006.01)
H03L 1/02 (2006.01)
H03L 1/04 (2006.01)
H05K 1/11 (2006.01)
H05K 1/18 (2006.01)
H10N 30/88 (2023.01)

(52) U.S. Cl.
CPC ............. *H03B 5/32* (2013.01); *H03B 1/02* (2013.01); *H03B 5/04* (2013.01); *H03L 1/028* (2013.01); *H03L 1/04* (2013.01); *H05K 1/111* (2013.01); *H05K 1/181* (2013.01); *H10N 30/88* (2023.02); *H05K 2201/10083* (2013.01)

(58) Field of Classification Search
CPC .... H03B 1/02; H03B 5/32; H03B 5/04; H03L 1/04; H03L 1/028; H05K 1/0212
See application file for complete search history.

(56) References Cited

U.S. PATENT DOCUMENTS

| | | | |
|---|---|---|---|
| 2007/0247249 A1* | 10/2007 | Ishikawa | H03L 1/023 331/176 |
| 2010/0225405 A1* | 9/2010 | Navet | H03L 1/028 331/70 |
| 2021/0036658 A1* | 2/2021 | Tseng | H01L 23/145 |

FOREIGN PATENT DOCUMENTS

| | | |
|---|---|---|
| EP | 2 228 903 A1 | 9/2010 |
| JP | 2010-213280 A | 9/2010 |
| JP | 2015-033065 A | 2/2015 |

* cited by examiner

*Primary Examiner* — Ryan Johnson
(74) *Attorney, Agent, or Firm* — Rankin, Hill & Clark LLP

(57) ABSTRACT

A circuit board includes: a semiconductor substrate including a first surface and a second surface located at an opposite side from the first surface; a circuit provided at a first surface side; a first external electrode provided at a second surface side; a heater provided at the second surface side; and a plurality of through electrodes penetrating the first surface and the second surface and electrically coupling the circuit and the first external electrode or the heater. The heater and the first external electrode do not overlap each other in a plan view.

8 Claims, 12 Drawing Sheets

CIRCUIT BOARD AND OSCILLATOR DEVICE

The present application is based on, and claims priority from JP Application Serial Number 2022-037855, filed on Mar. 11, 2022, the disclosure of which is hereby incorporated by reference herein in its entirety.

BACKGROUND

1. Technical Field

The present disclosure relates to a circuit board and an oscillator device.

2. Related Art

For example, JP-A-2010-213280 discloses a quartz crystal oscillator device in which an integrated circuit chip provided with an oscillation circuit, a temperature sensor, and a heating unit, and a piezoelectric vibrator element mounted on an integrated circuit are accommodated in an airtight case in order to obtain a stable vibrator frequency against changes in ambient temperature.

However, in the quartz crystal oscillator device disclosed in JP-A-2010-213280, an input and output terminal that receives signals from the outside and outputs signals to the outside is also provided on an active surface of the integrated circuit provided with the oscillation circuit, the temperature sensor, and the heating unit. Therefore, there is a problem that a size of the integrated circuit chip cannot be reduced.

SUMMARY

Provided is a circuit board including: a semiconductor substrate including a first surface and a second surface located at an opposite side from the first surface; a circuit provided at a first surface side; a first external electrode provided at a second surface side; a heater provided at the second surface side; and a plurality of through electrodes penetrating the first surface and the second surface and electrically coupling the circuit and the first external electrode or the heater. The heater and the first external electrode do not overlap each other in a plan view.

Provided is an oscillator device including: the circuit board described above; a base including a third surface facing the second surface, the circuit board being mounted on the third surface; a vibrator element disposed at the first surface side of the circuit board and electrically coupled to the circuit board; and a lid bonded to the base so as to form a cavity that accommodates the circuit board and the vibrator element between the lid and the base.

Provided is an oscillator device including: the circuit board described above; a base including a third surface facing the first surface, the circuit board being mounted on the third surface; a vibrator element disposed at the second surface side of the circuit board and electrically coupled to the first external electrode of the circuit board; and a lid bonded to the base so as to form a cavity that accommodates the circuit board and the vibrator element between the lid and the base.

DESCRIPTION OF EXEMPLARY EMBODIMENTS

1. First Embodiment

Figure 1:
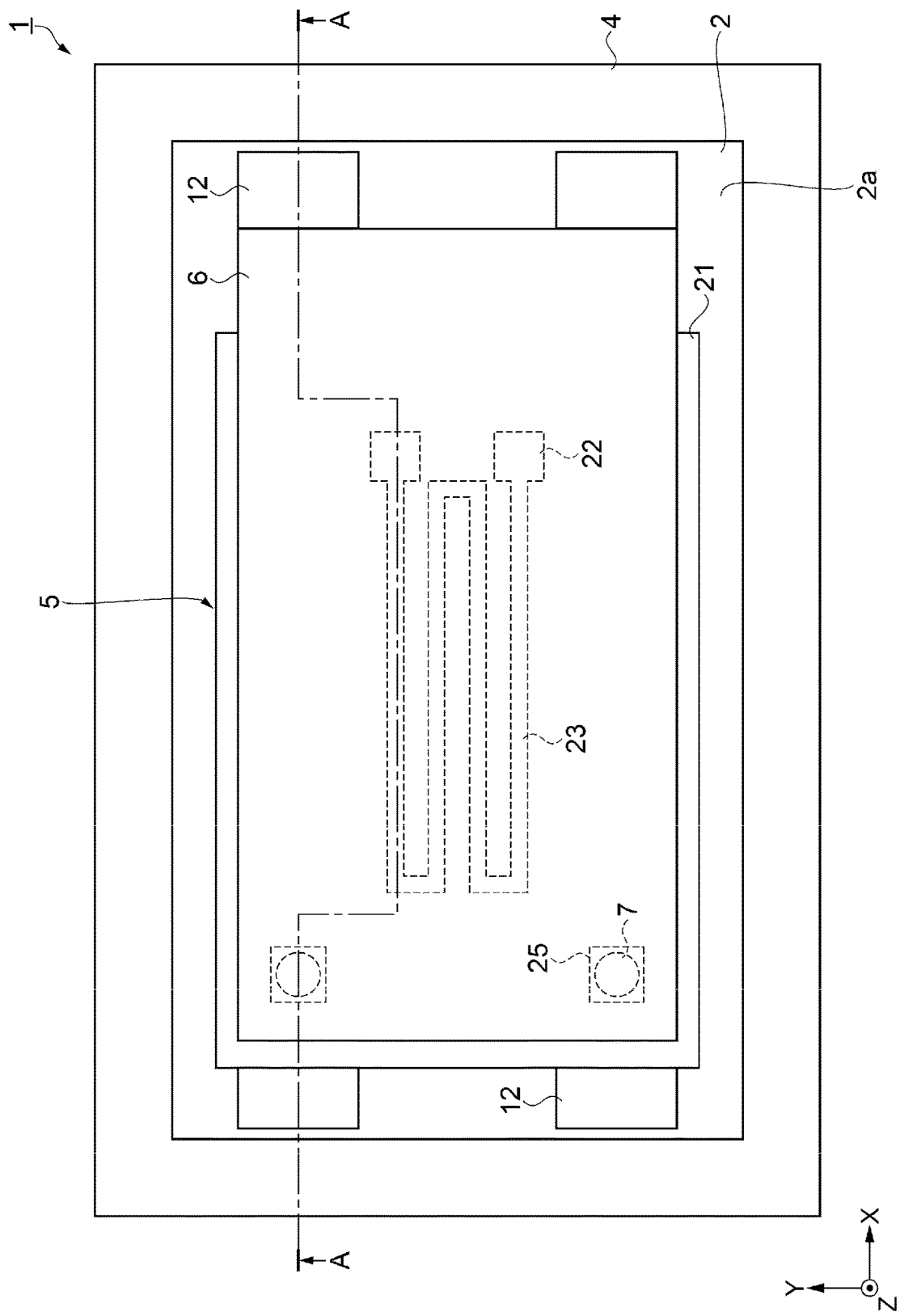
FIG. 1 is a plan view showing an oscillator device including a circuit board according to a first embodiment.

First, an oscillator device 1 including a circuit board 5 according to a first embodiment will be described with reference to FIGS. 1 to 4 by taking, as an example, an oscillator in which the circuit board 5 and a vibrator element 6 are accommodated in a cavity S formed by a base 2 and a lid 3.

Figure 2:
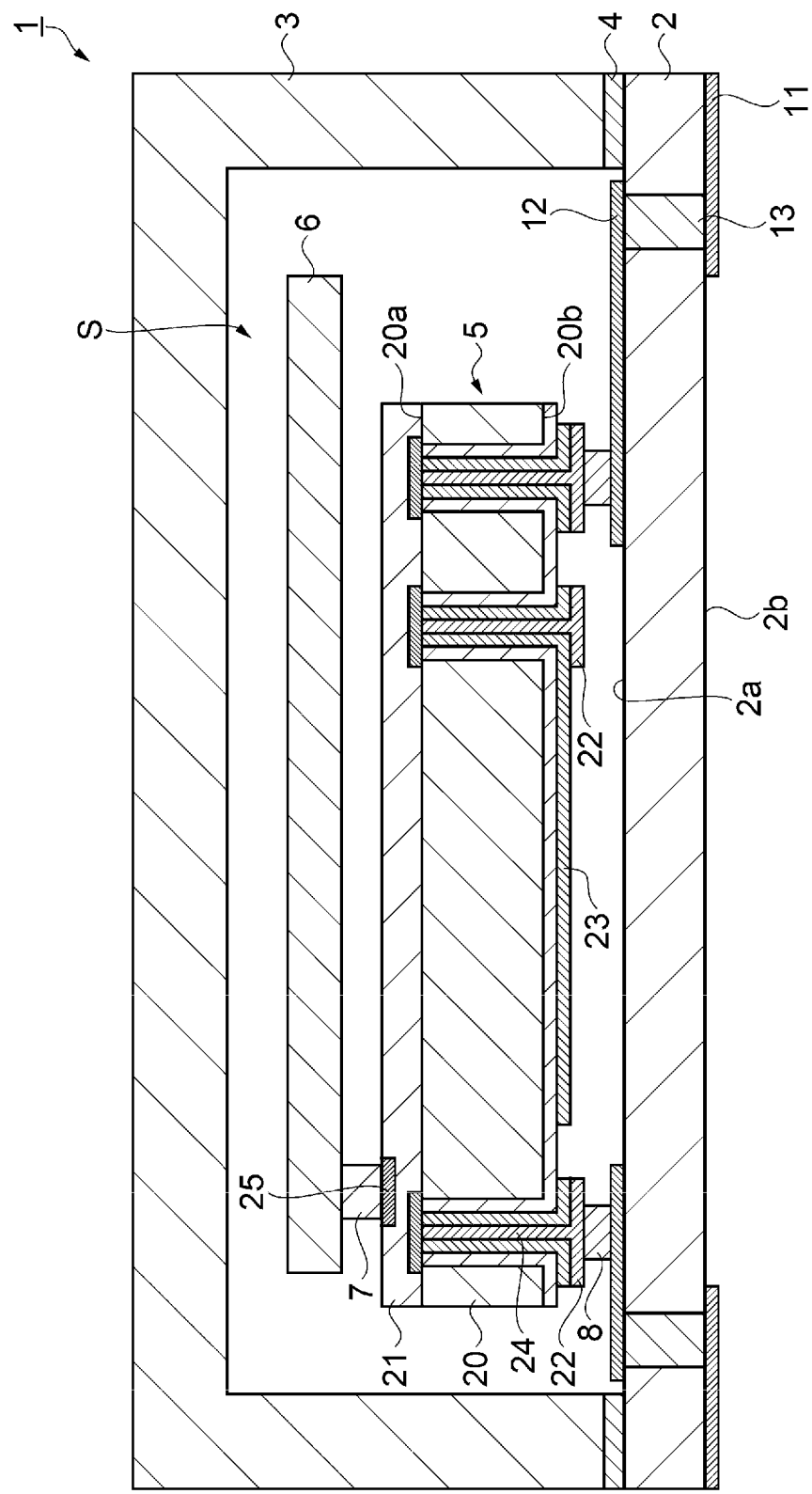
FIG. 2 is a cross-sectional view taken along a line A-A in FIG. 1.

FIG. 1 shows a state in which the lid 3 is removed for convenience of description of an internal configuration of the oscillator device 1. In FIGS. 1 and 2, electrodes provided on front and back surfaces of the vibrator element 6 are not shown. For convenience of description, the following plan views and cross-sectional views show an X axis, a Y axis, and a Z axis as three axes orthogonal to one another. A direction along the X axis is referred to as an "X direction", a direction along the Y axis is referred to as a "Y direction", and a direction along the Z axis is referred to as a "Z direction".

As shown in FIGS. 1 and 2, the oscillator device 1 includes the base 2 including a third surface 2a on which the circuit board 5 is mounted, the lid 3 bonded to the base 2 so as to form the cavity S that accommodates the circuit board 5 and the vibrator element 6 between the lid 3 and the base 2, the circuit board 5, and the vibrator element 6 disposed at a first surface 20a side of the circuit board 5 and electrically coupled to the circuit board 5.

The base 2 is a flat plate having a rectangular shape in a plan view from the Z direction, and includes the third surface 2a and a fourth surface 2b located at an opposite side from the third surface 2a. A plurality of coupling terminals 12 are provided on the third surface 2a, a plurality of external terminals 11 are provided on the fourth surface 2b, and the coupling terminal 12 and the external terminal 11 are electrically coupled by a through electrode 13 penetrating the third surface 2a and the fourth surface 2b.

The circuit board 5 is mounted on the third surface 2a of the base 2 facing a second surface 20b of the circuit board 5, and the circuit board 5 is mechanically and electrically coupled to the base 2 via metal bumps 8 disposed between first external electrodes 22 of the circuit board 5 and the coupling terminals 12 of the base 2. Ceramic, a semiconductor substrate, or the like is preferable as a constituent material of the base 2.

The lid 3 has a rectangular shape in the plan view from the Z direction, has the cavity S in a surface facing the base 2, accommodates the circuit board 5 and the vibrator element 6 in the cavity S, and is bonded to the base 2 via a bonding member 4. Inside of the cavity S is in a depressurized state, preferably in a state close to a vacuum. Accordingly, a viscous resistance is reduced and oscillation characteristics of the vibrator element 6 are improved. Ceramic, metal, a semiconductor substrate, or the like is preferable as a constituent material of the lid 3.

Figure 3:
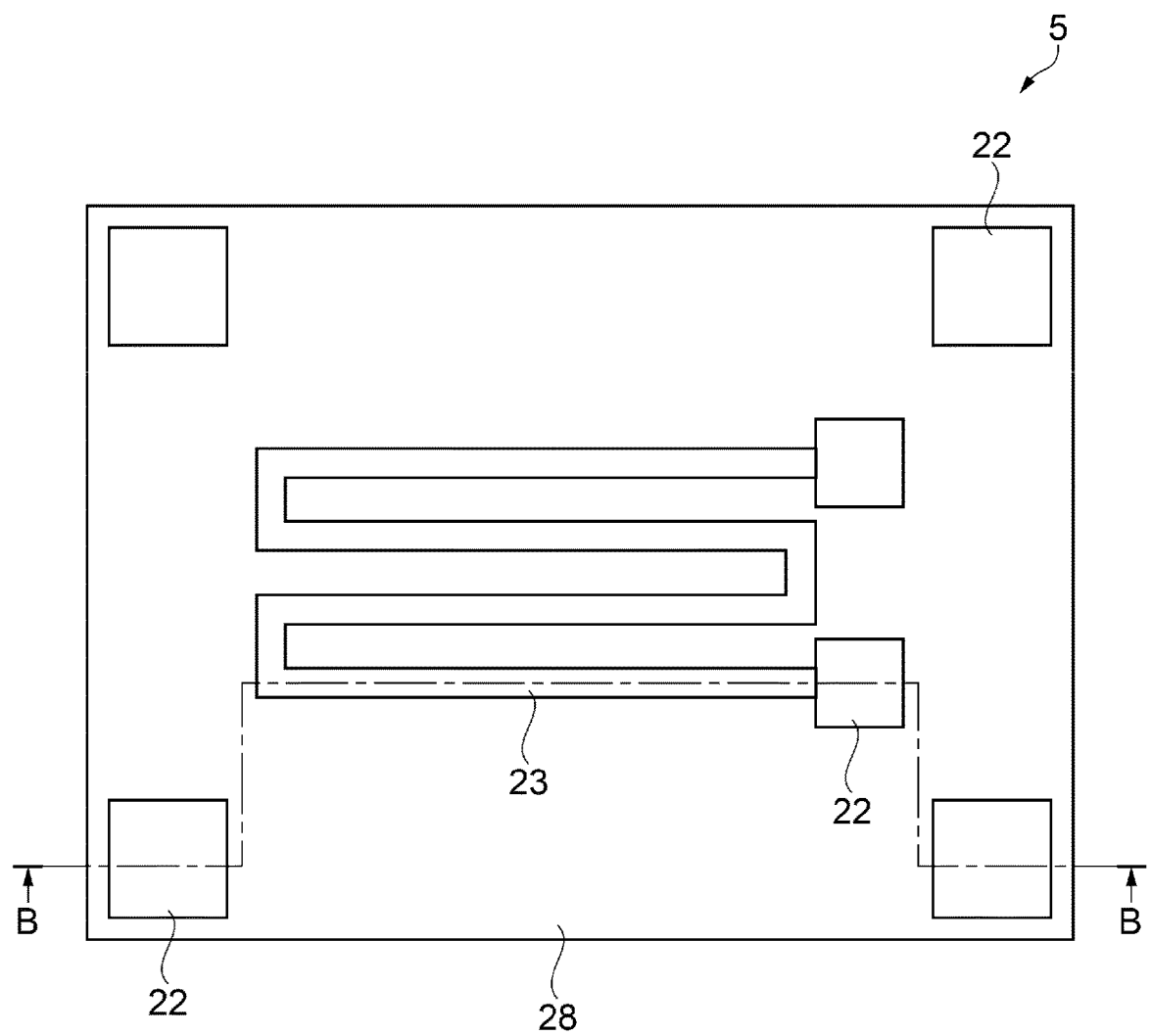
FIG. 3 is a plan view showing the circuit board according to the first embodiment.
Figure 4:
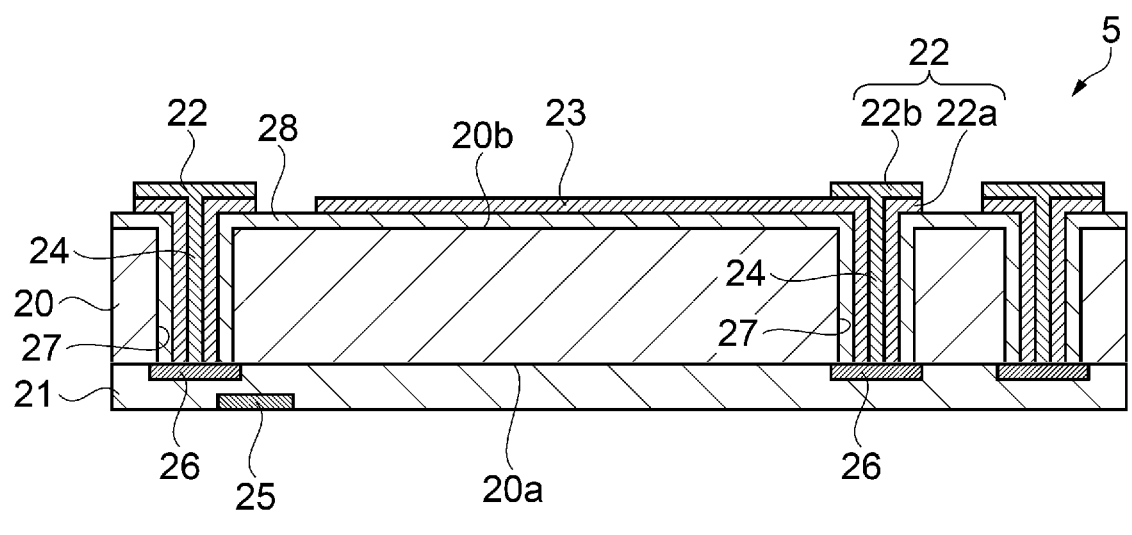
FIG. 4 is a cross-sectional view taken along a line B-B in FIG. 3.
Figure 4:
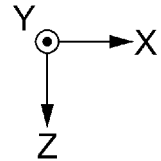

As shown in FIGS. 3 and 4, the circuit board 5 is a flat plate having a rectangular shape in the plan view from the Z direction, and includes a semiconductor substrate 20 including a first surface 20a and the second surface 20b located at an opposite side from the first surface 20a, a circuit 21 provided at the first surface 20a side, a plurality of first external electrodes 22 provided at a second surface 20b side, a heater 23 provided at the second surface 20b side, a plurality of through electrodes 24 penetrating the first surface 20a and the second surface 20b and electrically coupling the circuit 21 and the first external electrodes 22 or the heater 23, and second external electrodes 25 provided at an opposite side of the circuit 21 from the first surface 20a side and electrically coupled to the vibrator element 6. The semiconductor substrate 20 is preferably a single crystal silicon substrate.

The circuit 21 including an oscillation circuit, a temperature sensor circuit, and a temperature control circuit electrically coupled to the heater 23 is disposed on the first surface 20a of the semiconductor substrate 20. The circuit 21 is provided with internal electrodes 26, each of which electrically couples the circuit 21 and the through electrode 24 to each other at the first surface 20a side of the semiconductor substrate 20, and the second external electrodes 25, each of which electrically couples the circuit 21 and the vibrator element 6 to each other at an opposite side from the first surface 20a.

In the semiconductor substrate 20, an insulating film 28 formed of an $SiO_2$ film or the like for insulating the semiconductor substrate 20 from the through electrode 24 is provided on the second surface 20b and on an inner wall of a through hole 27 penetrating the first surface 20a and the second surface 20b of the semiconductor substrate 20. The through electrode 24 includes a first wiring layer 22a such as a TiW film formed on the insulating film 28 provided on the inner wall of the through hole 27, and a second wiring layer 22b such as a Cu film formed on the first wiring layer 22a. The through electrode 24 has a structure in which the second wiring layer 22b is embedded in the through hole 27 whose inner wall is provided with the insulating film 28 and the first wiring layer 22a. The first external electrode 22 is disposed on the through electrode 24, the first external electrode 22 including the first wiring layer 22a formed on the second surface 20b and the second wiring layer 22b formed on the first wiring layer 22a. An end portion at an opposite side of the through electrode 24 from the first external electrode 22 is electrically coupled to the internal electrode 26 provided in the circuit 21. Therefore, four first external electrodes 22 disposed at four corners of the circuit board 5 are electrically coupled to the circuit 21 via the through electrodes 24 in the plan view from the Z direction, and function as input and output terminals for outputting signals from the circuit 21 and inputting signals to the circuit 21. Although four first external electrodes 22 are used for the input and output terminals in the embodiment, the number of the first external electrodes 22 is not limited thereto, and may be four or more.

On the second surface 20b of the semiconductor substrate 20, the heater 23 that heats the circuit board 5 and keeps a temperature inside the cavity S constant is formed in a central portion of the circuit board 5 in the plan view from the Z direction. The heater 23 is formed of the first wiring layer 22a that is the same wiring layer as the first wiring layer 22a forming the first external electrode 22. Therefore, two first external electrodes 22 and the heater 23 are electrically coupled by the first wiring layer 22a at both end portions of the heater 23, and are electrically coupled to the temperature control circuit of the circuit 21 via the through electrodes 24 and the internal electrodes 26, whereby the heater 23 is controlled, and temperatures of the circuit board 5 and the vibrator element 6 can be stably maintained.

The circuit board 5 has a configuration in which the circuit 21 is disposed on the first surface 20a of the semiconductor substrate 20, the first external electrodes 22 and the heater 23 are disposed on the second surface 20b of the semiconductor substrate 20, and the circuit 21 is electrically coupled to the first external electrodes 22 and the heater 23 via the through electrodes 24. Therefore, a size of the circuit board 5 can be reduced compared with a case where the circuit 21, the first external electrodes 22, and the heater 23 are disposed on the first surface 20a of the semiconductor substrate 20.

The first external electrodes 22 provided on the second surface 20b of the semiconductor substrate 20 and the heater 23 do not overlap each other in the plan view from the Z direction. Since the first external electrodes 22 and the heater 23 do not overlap each other, a size of the heater 23 can be increased, and a heat capacity and a heating area can be increased. Therefore, the temperatures of the circuit board 5 and the vibrator element 6 can be more stably maintained.

The vibrator element 6 is disposed above the first surface 20a of the circuit board 5, and is mechanically and electrically coupled to a pair of second external electrodes 25 via a pair of metal bumps 7. Therefore, since the vibrator element 6 is electrically coupled to the oscillation circuit of the circuit 21 via the second external electrodes 25, the vibrator element 6 can be easily oscillated. The vibrator element 6 according to the embodiment is an AT cut quartz crystal vibrator element, and may be an SC cut quartz crystal vibrator element or a BT cut quartz crystal vibrator element. A constituent material of the vibrator element 6 is not limited to quartz crystal, and may be, for example, a piezoelectric single crystal body such as lithium niobate, lithium tantalate, lithium tetraborate, langasite, potassium niobate, or gallium phosphate.

As described above, the circuit board 5 according to the embodiment has the configuration in which the circuit 21 serving as an active surface of an integrated circuit is disposed on the first surface 20a of the semiconductor substrate 20, the first external electrodes 22 serving as the input and output terminals and the heater 23 serving as a heating unit are disposed on the second surface 20b of the semiconductor substrate 20, and the circuit 21 is electrically coupled to the first external electrodes 22 and the heater 23 via the through electrodes 24. Therefore, the size of the circuit board 5 can be reduced as compared with the case where the circuit 21, the first external electrodes 22, and the heater 23 are disposed on the first surface 20a of the semiconductor substrate 20. Further, wire bonding or the like for electrically coupling the first external electrodes 22 serving as the input and output terminals and the coupling terminals 12 of the base 2 is not necessary, and a size of the oscillator device 1 can be reduced.

The first external electrodes 22 and the heater 23 provided on the second surface 20b of the semiconductor substrate 20 do not overlap each other in the plan view from the Z direction. Therefore, the size of the heater 23 can be increased, and the heat capacity and the heating area can be increased, and thus the temperatures of the circuit board 5 and the vibrator element 6 can be more stably maintained.

Next, a method for manufacturing the circuit board 5 according to the first embodiment will be described with reference to FIGS. 5 to 10.

Figure 5:
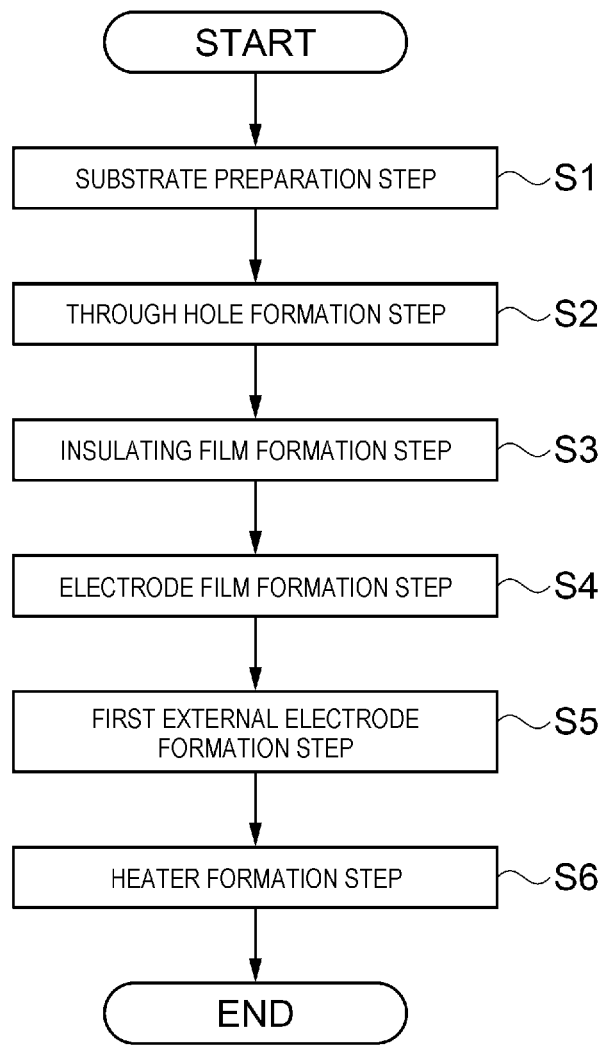
FIG. 5 is a flowchart showing a method for manufacturing the circuit board according to the first embodiment.

As shown in FIG. 5, the method for manufacturing the circuit board 5 according to the embodiment includes a substrate preparation step, a through hole formation step, an insulating film formation step, an electrode film formation step, a first external electrode formation step, and a heater formation step.

1.1. Substrate Preparation Step

First, the semiconductor substrate 20 on which the circuit 21 is formed is prepared in step S1. The semiconductor substrate 20 is preferably a single crystal silicon substrate.

1.2. Through Hole Formation Step

Figure 6:
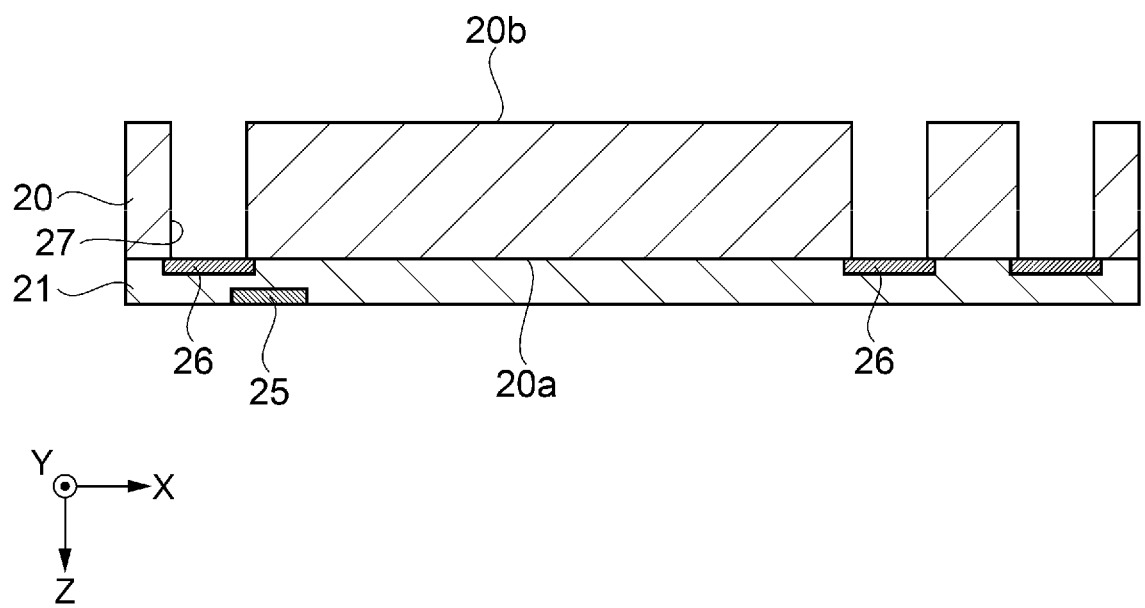
FIG. 6 is a cross-sectional view showing the method for manufacturing the circuit board.

In step S2, as shown in FIG. 6, the through hole 27 is formed by photolithography at a position where the through electrode 24 is to be provided, that is, at a position overlapping the internal electrode 26 in the plan view from the Z direction.

1.3. Insulating Film Formation Step

Figure 7:
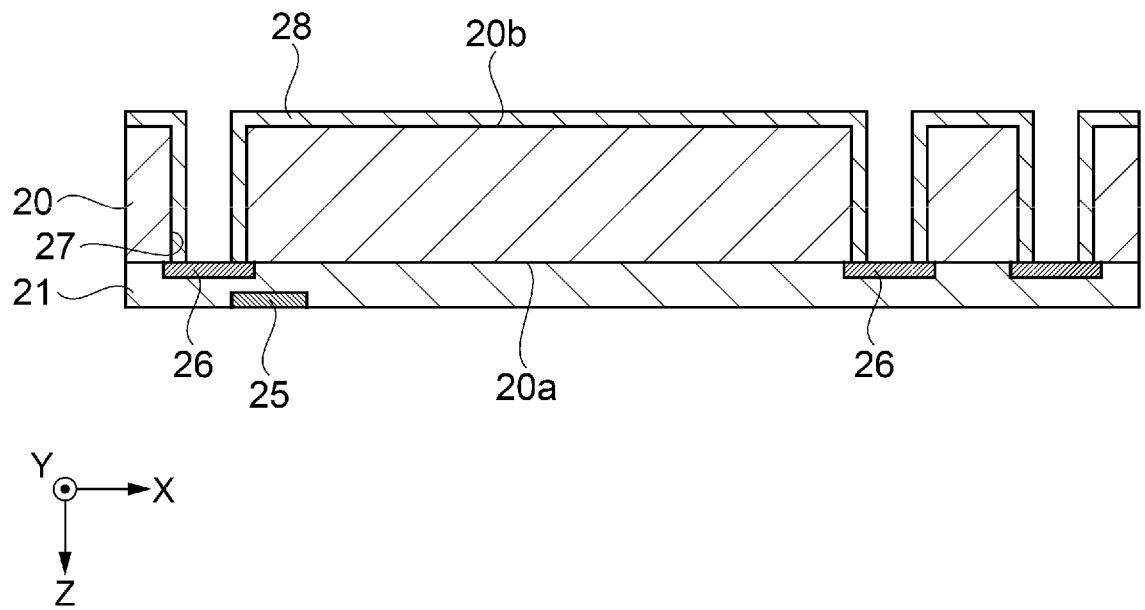
FIG. 7 is a cross-sectional view showing the method for manufacturing the circuit board.

In step S3, the insulating film 28 is formed on the second surface 20b of the semiconductor substrate 20 and on an inner surface of the through hole 27. A method for forming the insulating film 28 is not particularly limited, and for example, chemical vapor deposition (CVD) can be used. Thereafter, only the insulating film 28 formed on an inner bottom surface of the through hole 27 is removed by exposure and development, and the internal electrode 26 is exposed as the inner bottom surface of the through hole 27 as shown in FIG. 7. In this way, the insulating film 28 is formed on the second surface 20b and on the inner wall of the through hole 27.

1.4. Electrode Film Formation Step

Figure 8:
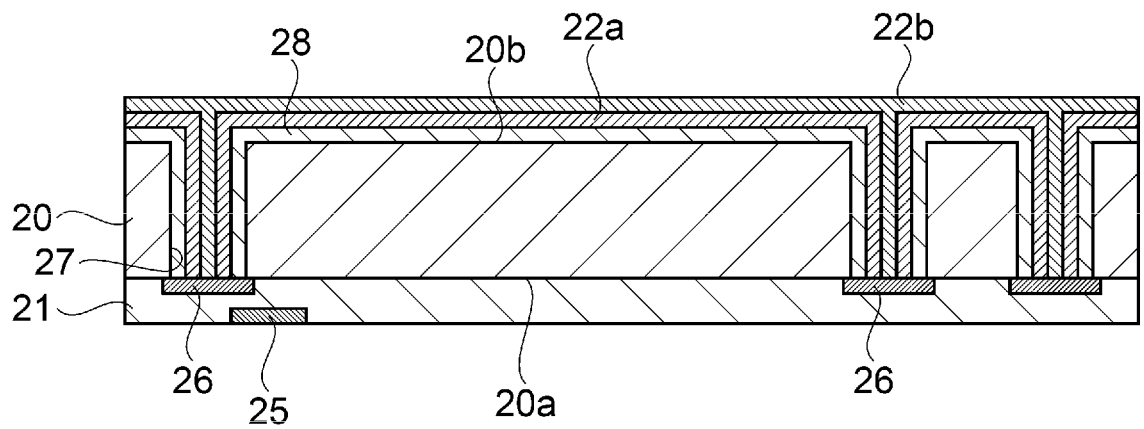
FIG. 8 is a cross-sectional view showing the method for manufacturing the circuit board.
Figure 8:
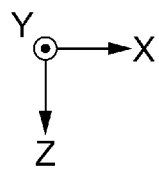

In step S4, as shown in FIG. 8, the first wiring layer 22a such as a TiW film is formed on the insulating film 28 by a sputtering method, a vapor deposition method, or the like, and then the second wiring layer 22b is formed on the first wiring layer 22a by the sputtering method, the vapor deposition method, a plating method, a paste embedding method, or the like. The first wiring layer 22a improves adhesion between the insulating film 28 and the second wiring layer 22b.

1.5. First External Electrode Formation Step

Figure 9:
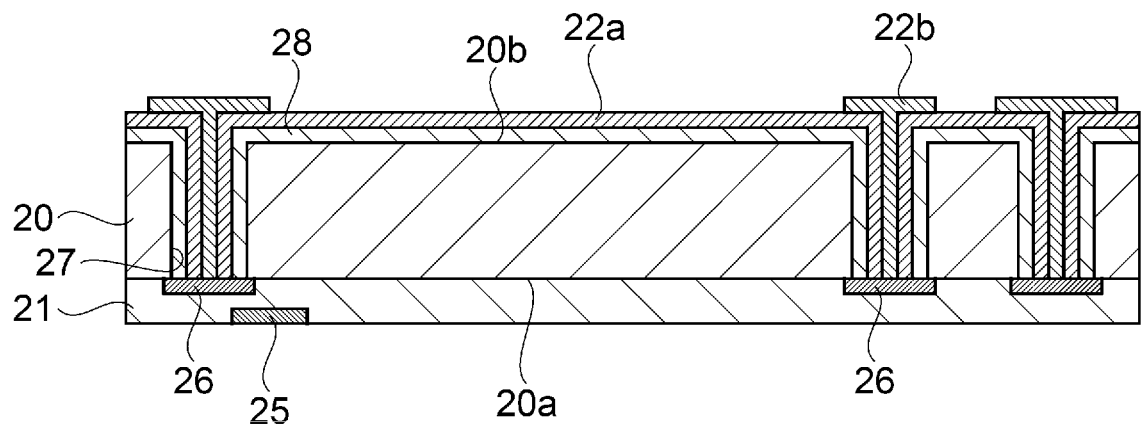
FIG. 9 is a cross-sectional view showing the method for manufacturing the circuit board.
Figure 9:
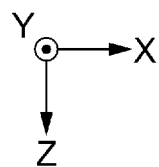

In step S5, as shown in FIG. 9, the first external electrode 22 including only the second wiring layer 22b is formed at the position overlapping the internal electrode 26 by etching the second wiring layer 22b by the photolithography.

1.6. Heater Formation Step

Figure 10:
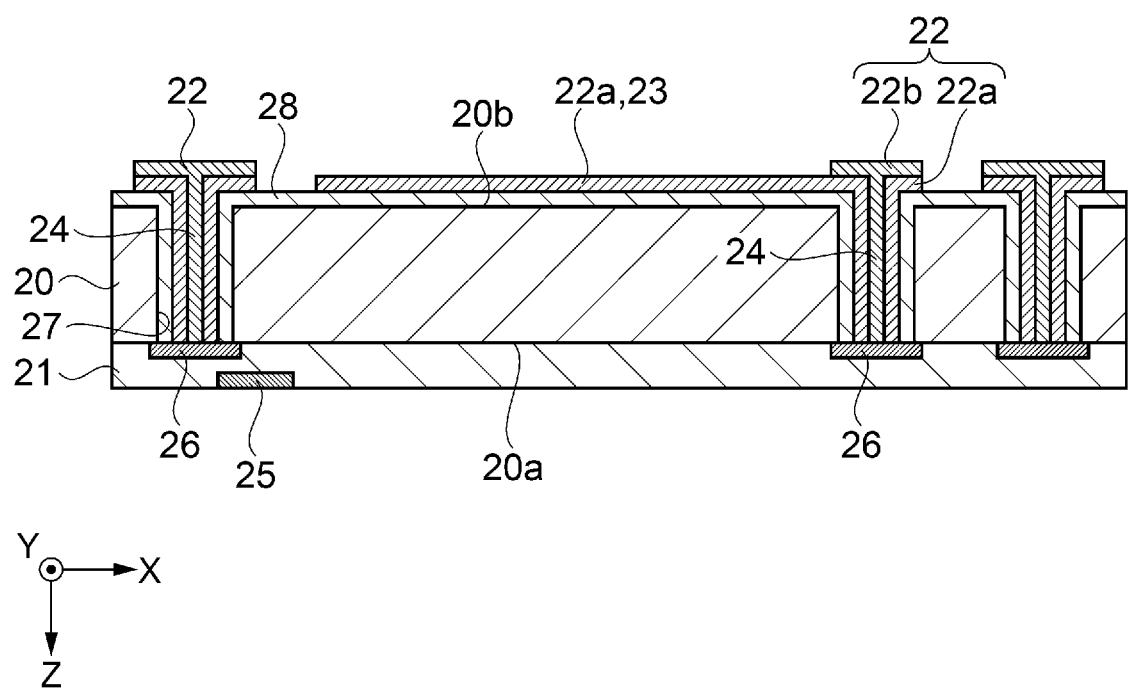
FIG. 10 is a cross-sectional view showing the method for manufacturing the circuit board.

In step S6, as shown in FIG. 10, the first external electrode 22 including the first wiring layer 22a and the second wiring layer 22b, and the heater 23 including the first wiring layer 22a are formed by etching the first wiring layer 22a by the photolithography.

In the method for manufacturing the circuit board 5 described above, since the first wiring layer 22a forming the first external electrode 22 can be used to form the heater 23, a new film formation step is not required to form the heater 23, and a cost can be reduced.

2. Second Embodiment

Next, an oscillator device 1a including a circuit board 5a according to a second embodiment will be described with reference to FIGS. 11 to 14.

Figure 11:
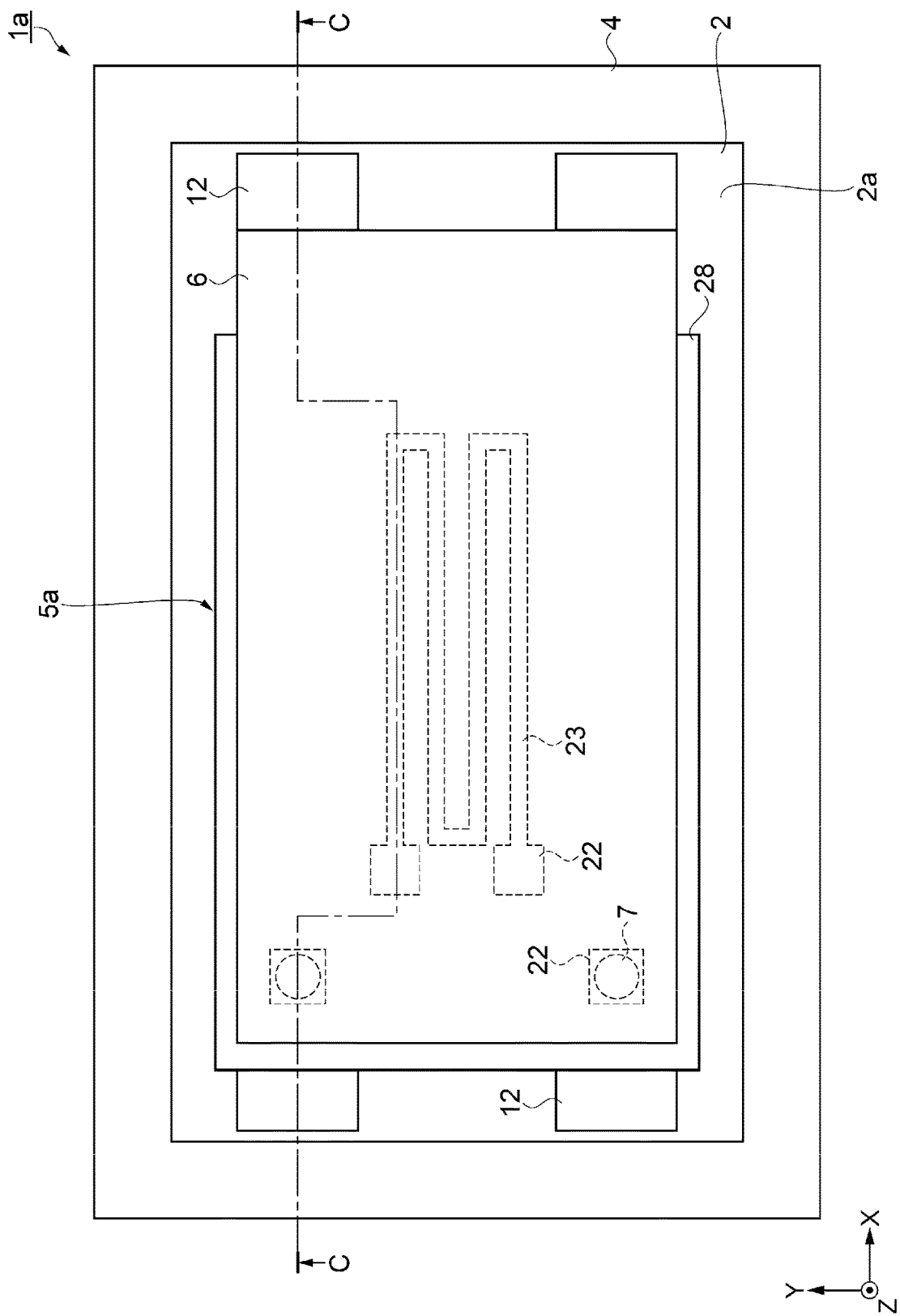
FIG. 11 is a plan view showing an oscillator device including a circuit board according to a second embodiment.
Figure 12:
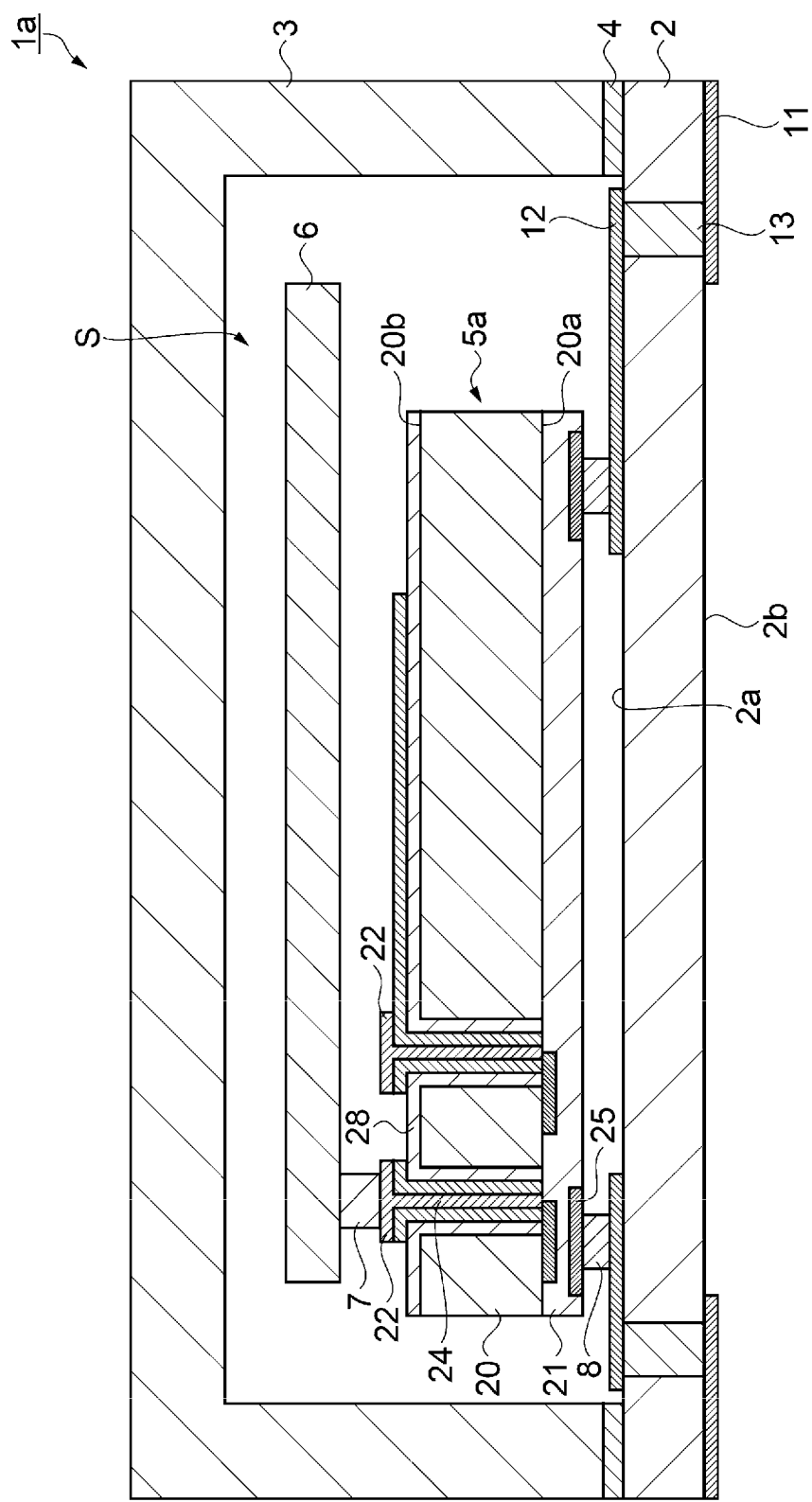
FIG. 12 is a cross-sectional view taken along a line C-C in FIG. 11.

FIG. 11 shows a state in which the lid 3 is removed for convenience of description of an internal configuration. In FIGS. 11 and 12, electrodes provided on front and back surfaces of the vibrator element 6 are not shown.

The circuit board 5a according to the embodiment is the same as the circuit board 5 according to the first embodiment except that arrangement positions and the number of the first external electrodes 22 and the through electrodes 24 are different from those of the circuit board 5 according to the first embodiment. Differences from the first embodiment described above will be mainly described, and the same components will be denoted by the same reference numerals, and description thereof will be omitted.

As shown in FIGS. 11 and 12, the oscillator device 1a includes the base 2 including the third surface 2a on which the circuit board 5a is mounted, the lid 3 bonded to the base 2 so as to form the cavity S that accommodates the circuit board 5a and the vibrator element 6 between the lid 3 and the base 2, the circuit board 5a, and the vibrator element 6 disposed at a second surface 20b side of the circuit board 5a and electrically coupled to the circuit board 5a. That is, the circuit board 5a is mounted upside down as compared with the oscillator device 1 according to the first embodiment.

Figure 13:
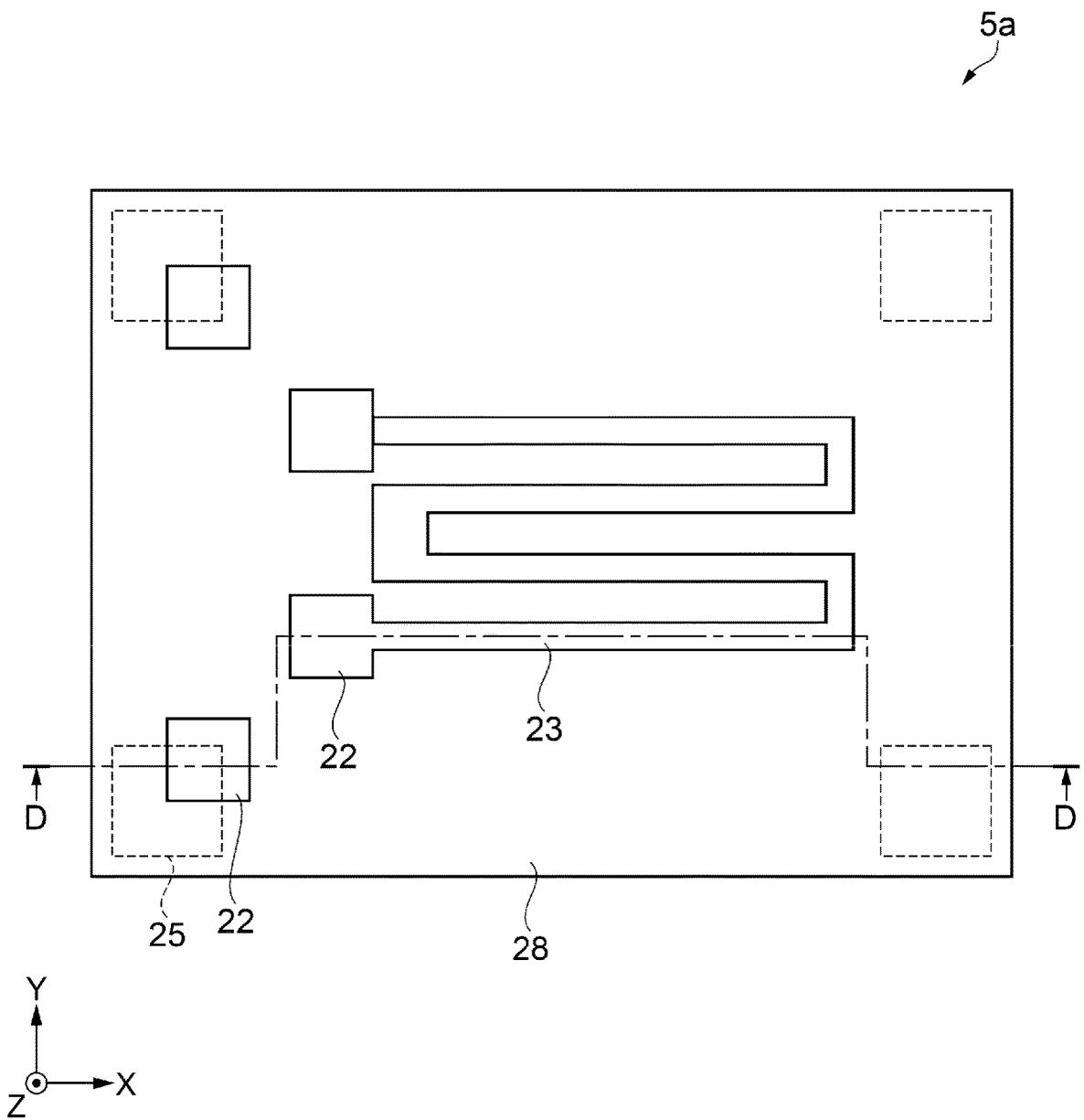
FIG. 13 is a plan view showing the circuit board according to the second embodiment.
Figure 14:
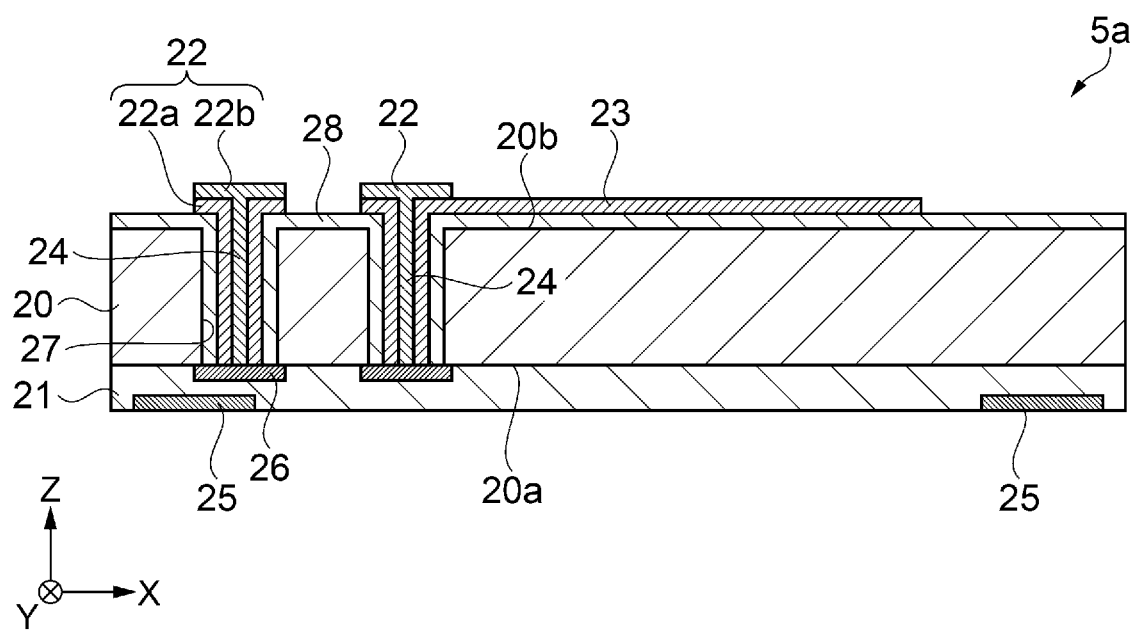
FIG. 14 is a cross-sectional view taken along a line D-D in FIG. 13.

As shown in FIGS. 13 and 14, the circuit board 5a is a flat plate having a rectangular shape in a plan view from the Z direction, and includes the semiconductor substrate 20 having the first surface 20a and the second surface 20b located at an opposite side from the first surface 20a, the circuit 21 provided at a first surface 20a side, the plurality of first external electrodes 22 provided at the second surface 20b side, the heater 23 provided at the second surface 20b side, the plurality of through electrodes 24 penetrating the first surface 20a and the second surface 20b and electrically coupling the circuit 21 and the first external electrodes 22 or the heater 23, and the second external electrodes 25 electrically coupled to the coupling terminals 12 at the first surface 20a side of the circuit 21.

The circuit board 5a is electrically coupled to the base 2 via the metal bumps 8 disposed between the four coupling terminals 12 and the four second external electrodes 25 disposed at four corners of the circuit board 5a in the plan view from the Z direction.

The vibrator element 6 is disposed above the second surface 20b of the circuit board 5a, and is mechanically and electrically coupled to the pair of first external electrodes 22 via the pair of metal bumps 7.

With such a configuration, the same effects as those of the circuit board 5 and the oscillator device 1 according to the first embodiment can be attained.

What is claimed is:

1. A circuit board comprising:
   a semiconductor substrate including a first surface and a second surface located at an opposite side from the first surface;
   a circuit provided at a first surface side;
   a first external electrode provided at a second surface side;

a heater provided at the second surface side; and a plurality of through electrodes penetrating the first surface and the second surface and electrically coupling the circuit and the first external electrode or the heater, wherein the heater and the first external electrode do not overlap each other in a plan view.

2. The circuit board according to claim 1, wherein the heater is formed of the same wiring layer as a wiring layer forming the first external electrode.

3. The circuit board according to claim 1, wherein the first external electrode includes a first wiring layer formed on the second surface and a second wiring layer formed on the first wiring layer, and the heater is formed of the first wiring layer.

4. The circuit board according to claim 1, wherein the circuit includes an oscillation circuit, a temperature sensor circuit, and a temperature control circuit electrically coupled to the heater.

5. An oscillator device comprising:

the circuit board according to claim 1;

a base including a third surface facing the second surface, the circuit board being mounted on the third surface;

a vibrator element disposed at the first surface side of the circuit board and electrically coupled to the circuit board; and a lid bonded to the base so as to form a cavity that accommodates the circuit board and the vibrator element between the lid and the base.

6. The oscillator device according to claim 5, wherein the base includes a coupling terminal on the third surface, and the circuit board is electrically coupled to the base via a metal bump disposed between the first external electrode and the coupling terminal.

7. An oscillator device comprising:

the circuit board according to claim 1;

a base including a third surface facing the first surface, the circuit board being mounted on the third surface;

a vibrator element disposed at the second surface side of the circuit board and electrically coupled to the first external electrode of the circuit board; and a lid bonded to the base so as to form a cavity that accommodates the circuit board and the vibrator element between the lid and the base.

8. The oscillator device according to claim 7, wherein the base includes a coupling terminal on the third surface, and the circuit board includes a second external electrode at the first surface side, the second external electrode being electrically coupled to the coupling terminal, and the circuit board is electrically coupled to the base via a metal bump disposed between the second external electrode and the coupling terminal.

* * * * *